US008482029B2

(12) United States Patent
Mauder et al.

(10) Patent No.: US 8,482,029 B2
(45) Date of Patent: Jul. 9, 2013

(54) SEMICONDUCTOR DEVICE AND INTEGRATED CIRCUIT INCLUDING THE SEMICONDUCTOR DEVICE

(75) Inventors: Anton Mauder, Kolbermoor (DE); Franz Hirler, Isen (DE); Joachim Weyers, Hoehenkirchen (DE)

(73) Assignee: Infineon Technologies Austria AG, Villach (AT)

( * ) Notice: Subject to any disclaimer, the term of this patent is extended or adjusted under 35 U.S.C. 154(b) by 11 days.

(21) Appl. No.: 13/117,908

(22) Filed: May 27, 2011

(65) Prior Publication Data

US 2012/0299053 A1    Nov. 29, 2012

(51) Int. Cl.
*H01L 29/66*    (2006.01)
(52) U.S. Cl.
USPC ........... 257/139; 438/224; 257/328; 257/341; 257/471; 257/382; 257/77; 257/256; 257/110; 257/143; 257/492; 257/330
(58) Field of Classification Search
USPC .................. 257/139, 328, 341, 471, 382, 77, 257/256, 110, 143, 492, 330, 355, 336; 438/224
See application file for complete search history.

(56) References Cited

U.S. PATENT DOCUMENTS

| | | | | |
|---|---|---|---|---|
| 3,712,995 A | * | 1/1973 | Steudel | 361/110 |
| 3,821,566 A | * | 6/1974 | Cricchi | 327/543 |
| 4,173,767 A | * | 11/1979 | Stevenson | 257/373 |
| 4,757,363 A | * | 7/1988 | Bohm et al. | 257/358 |
| 4,890,146 A | * | 12/1989 | Williams et al. | 257/336 |
| 5,036,215 A | * | 7/1991 | Masleid et al. | 327/410 |
| 5,083,179 A | * | 1/1992 | Chong et al. | 257/369 |
| 5,124,772 A | * | 6/1992 | Hideshima et al. | 257/110 |
| 5,285,369 A | | 2/1994 | Balakrishnan | |
| 5,360,984 A | * | 11/1994 | Kirihata | 257/143 |
| 5,430,311 A | * | 7/1995 | Murakami et al. | 257/146 |
| 5,500,548 A | * | 3/1996 | Smayling | 257/371 |
| 5,510,641 A | * | 4/1996 | Yee et al. | 257/367 |
| 5,723,882 A | * | 3/1998 | Okabe et al. | 257/139 |
| 5,835,985 A | * | 11/1998 | Hiyoshi et al. | 257/121 |
| 5,895,940 A | * | 4/1999 | Kim | 257/173 |
| 6,188,109 B1 | * | 2/2001 | Takahashi | 257/355 |
| 7,009,228 B1 | * | 3/2006 | Yu | 257/256 |

(Continued)

FOREIGN PATENT DOCUMENTS

DE    10 2007 004 091 A1    8/2008

OTHER PUBLICATIONS

Mirchandani, A., et al., "A Novel N-Channel MOSFET Featuring an Integrated Schottky and No Internal P-N Junction", Proceedings from 2004 International Symposium on Power Semiconductor Devices & ICs, Kitakyushu, pp. 405-408.

*Primary Examiner* — Fernando L Toledo
*Assistant Examiner* — Mohammed Shamsuzzaman
(74) *Attorney, Agent, or Firm* — Murphy, Bilak & Homiller, PLLC

(57) ABSTRACT

A semiconductor device includes a source metallization and a semiconductor body. The semiconductor body includes a first field-effect structure including a source region of a first conductivity type electrically coupled to the source metallization. The semiconductor body also includes a second field-effect structure including a source region of the first conductivity type electrically coupled to the source metallization. A voltage tap including a semiconductor region within the semiconductor body is electrically coupled to a first gate electrode of the first field-effect structure by an intermediate inverter structure.

16 Claims, 6 Drawing Sheets

U.S. PATENT DOCUMENTS

| | | | |
|---|---|---|---|
| 7,102,867 B2* | 9/2006 | Voldman | 361/93.1 |
| 7,560,783 B2* | 7/2009 | Kapels et al. | 257/382 |
| 7,629,626 B1* | 12/2009 | Suekawa | 257/170 |
| 7,679,136 B2* | 3/2010 | Kachi et al. | 257/330 |
| 7,692,214 B2* | 4/2010 | Tokura et al. | 257/197 |
| 7,709,891 B2* | 5/2010 | Mauder et al. | 257/341 |
| 7,855,862 B1* | 12/2010 | Gallagher et al. | 361/56 |
| 2001/0035554 A1* | 11/2001 | Yamauchi et al. | 257/340 |
| 2003/0020134 A1 | 1/2003 | Werner et al. | 257/471 |
| 2004/0094819 A1* | 5/2004 | Saitoh et al. | 257/492 |
| 2004/0124464 A1* | 7/2004 | Narazaki | 257/339 |
| 2005/0045952 A1* | 3/2005 | Chatty et al. | 257/355 |
| 2006/0091465 A1* | 5/2006 | Chen | 257/360 |
| 2006/0192086 A1* | 8/2006 | Niclass et al. | 250/214.1 |
| 2006/0278925 A1* | 12/2006 | Yamaguchi | 257/341 |
| 2007/0081280 A1* | 4/2007 | Strzalkowski et al. | 361/18 |
| 2007/0120201 A1* | 5/2007 | Yamaguchi et al. | 257/401 |
| 2008/0242016 A1* | 10/2008 | Cannon et al. | 438/224 |
| 2008/0258184 A1* | 10/2008 | Sankin et al. | 257/265 |
| 2008/0315248 A1* | 12/2008 | Tokura et al. | 257/139 |
| 2010/0078707 A1* | 4/2010 | Haeberlen et al. | 257/328 |
| 2010/0110596 A1* | 5/2010 | Pugsley | 361/56 |
| 2010/0118455 A1* | 5/2010 | Kusunoki | 361/56 |
| 2010/0140658 A1* | 6/2010 | Koyama et al. | 257/140 |
| 2010/0148244 A1* | 6/2010 | Kitabatake et al. | 257/328 |
| 2010/0148718 A1* | 6/2010 | Kitabatake et al. | 318/798 |
| 2011/0042714 A1* | 2/2011 | Ogura | 257/139 |
| 2011/0079792 A1* | 4/2011 | Lostetter et al. | 257/77 |
| 2011/0234829 A1 | 9/2011 | Gagvani et al. | |
| 2011/0265051 A1* | 10/2011 | Yeh et al. | 716/106 |
| 2012/0025264 A1* | 2/2012 | Kouno | 257/140 |
| 2012/0112273 A1* | 5/2012 | Aoki et al. | 257/334 |
| 2012/0161751 A1* | 6/2012 | Akiyama et al. | 324/117 R |
| 2012/0182051 A1* | 7/2012 | Aoki et al. | 327/109 |
| 2012/0299056 A1* | 11/2012 | Arai et al. | 257/144 |

* cited by examiner

SEMICONDUCTOR DEVICE AND INTEGRATED CIRCUIT INCLUDING THE SEMICONDUCTOR DEVICE

BACKGROUND

Field-effect controlled power switching structures such as a Metal Oxide Semiconductor Field-effect Transistors (MOSFETs) or an Insulated Gate Bipolar Transistors (IG-BTs) have been used for various applications including but not limited to switches in power supplies and power converters, e.g., half-bridges.

The direction of current flow through the field-effect controlled structures operating as switches is different in different operating cycles. In an on/off-mode or forward mode of the field-effect controlled structure, a pn-body diode at a body-drain junction of the field-effect controlled structure is reversely biased and the resistance of the device can be controlled by the voltage applied to the gate electrode of the field-effect controlled device. In a diode mode of the field-effect controlled device, the pn-body diode is forward biased. This results in a loss which is mainly determined by the product of current flow and voltage drop across the body diode. The pn-body diode may be forward biased when switching inductive loads, for example.

In view of meeting the demands on electrical characteristics of field-effect controlled power switching structures, it is desirable to reduce switching losses of the pn-body diode in field-effect controlled power switching structures.

SUMMARY

According to a first embodiment of a semiconductor device, the semiconductor device includes a source metallization and a semiconductor body. The semiconductor body includes a first field-effect structure including a source region of a first conductivity type electrically coupled to the source metallization. The semiconductor body further includes a second field-effect structure including a source region of the first conductivity type electrically coupled to the source metallization. A voltage tap including a semiconductor region within the semiconductor body is electrically coupled to a first gate electrode of the first field-effect structure by an intermediate inverter structure.

According to a second embodiment of a semiconductor device, the semiconductor device includes a source metallization and a semiconductor body. The semiconductor body includes a first field-effect structure including a source region of a first conductivity type electrically coupled to the source metallization. The semiconductor body further includes a second field-effect structure including a source region of the first conductivity type electrically coupled to the source metallization. A first gate electrode of the first field-effect structure is electrically coupled to a first gate driver circuit and a second gate electrode of the second field-effect structure is electrically coupled to a second gate driver circuit different from the first gate driver circuit. The first field-effect structure and the second field-effect structure share a common drain.

According to a first embodiment of an integrated circuit, the integrated circuit includes a half-bridge circuit. The half-bridge includes the semiconductor device of the first embodiment.

According to a second embodiment of an integrated circuit, the integrated circuit includes a half-bridge circuit. The half-bridge includes the semiconductor device of the second embodiment.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

DETAILED DESCRIPTION

Figure 1:
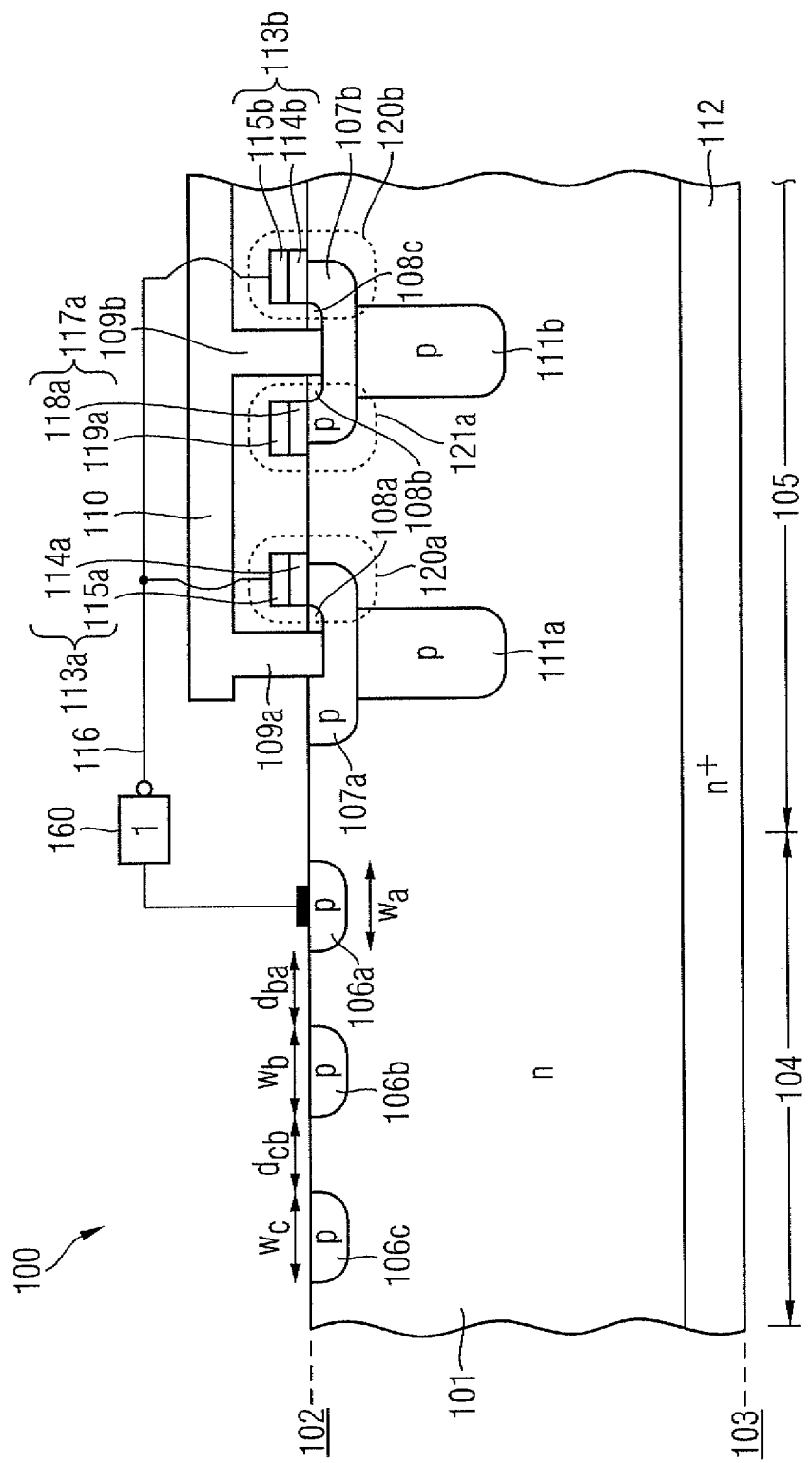
FIG. 1 is a schematic illustration of a vertical cross section through a part of a MOSFET including first and second field effect structures, wherein a gate electrode of the first field electrode structures is electrically coupled to a guard ring in an edge termination area.

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention include such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an n+ and a p+ region.

Specific embodiments described in this specification pertain to, without being limited thereto, power semiconductor devices which are controlled by field-effect and particularly to unipolar devices such as MOSFETs, bipolar devices such as IGBTs and unipolar and bipolar devices having compensation structures such as Superjunction-MOSFETs.

The term "field-effect" as used in this specification intends to describe the electric field mediated formation of an "inversion channel" and/or control of conductivity and/or shape of the inversion channel in a semiconductor region of the second conductivity type. Typically, the semiconductor region of the second conductivity type is arranged between two semiconductor regions of the first conductivity type and a unipolar current path through a channel region between the two semiconductor regions of the first conductivity type is formed and/or controlled by the electric field. The conductivity type of the channel region is typically changed to the first conductivity type, i.e., inverted, for forming the unipolar current path between the two semiconductor regions of the first conductivity type.

In the context of the present specification, the semiconductor region of the second conductivity type in which an inversion channel can be formed and/or controlled by the field-effect is also referred to as body region.

In the context of the present specification, the term "field-effect structure" intends to describe a structure which is formed in a semiconductor substrate or semiconductor body or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$) or stacks of two or more of the aforementioned materials.

Above a threshold voltage $V_{th}$ between the gate electrode and the body region, an inversion channel is formed and/or controlled due to the field-effect in a channel region of the body region adjoining the dielectric region or dielectric layer. The threshold voltage $V_{th}$ typically refers to the minimum gate voltage necessary for the onset of a unipolar current flow between the source and the drain of a transistor.

In the context of the present specification, devices such as MOS-controlled diodes (MCDs), MOSFETs, IGBTs and devices having compensation structures such as Superjunction-MOSFETs as well as integrated devices with different field-effect structures are also referred to as field-effect structures.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

In the context of the present specification, the terms "metal" and "metallization" should be understood as including the more general term conductor. For example, the material of a gate electrode has not necessarily to be made out of metal but can also be made of any conducting material like e.g. a semiconductor layer or a metal-semiconductor compound or any other suitable material.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1 schematically illustrates a vertical cross section through a part of a normally-off or enhancement mode MOSFET 100 according to an embodiment. The MOSFET 100 includes an n-type semiconductor body 101 with a first surface 102 and a second surface 103. The first surface 102 may be at a front side of the semiconductor body 101 and the second surface 103 may be at a rear side of the semiconductor body 101. FIG. 1 illustrates the cross-section in a vertical section plane which extends perpendicular to the first and second surfaces 102, 103.

The MOSFET 100 includes an edge termination area 104 and a cell area 105. In the embodiment illustrated in FIG. 1, the edge termination area 104 includes multiple floating p-type guard rings 106a, 106b, 106c. The guard rings 106a, 106b, 106c serve to reduce the amount of electric field crowding at a main pn-junction in the cell area 105 by spreading the depletion layer past consecutively lower potential floating junctions of the guard rings 106a, 106b, 106c. These independent junctions act to increase the depletion layer spreading, thereby decreasing the high electric field at the main pn-junction in the cell area 105.

According to one embodiment, the guard rings 106a, 106b, 106c are fabricated simultaneously with semiconductor regions in the cell area 105. As an example, the guard rings 106a, 106b, 106c may be fabricated simultaneously with a body region in the cell area 105 of the MOSFET 100. According to another embodiment, the guard rings 106a, 106b, 106c may be fabricated independently from semiconductor regions in the cell area. For illustration purposes, a number n of the guard rings 106a, 106b, 106c illustrated in FIG. 1 is 3. However, a different number n of the guard rings may be used such as n=1, 2, 4, 5, 6, 7, 8, for example. Widths $w_a$, $w_b$, $w_c$ of the guard rings 106a, 106b, 106c may match, differ or partly differ. Similarly, distances $d_{cb}$ and $d_{ba}$ between the guard rings 106c, 106b and 106b, 106a may also match or differ.

The cell area 105 includes p-type body regions 107a, 107b and $n^+$-type source regions 108a, 108b, 108c. The p-type body regions 107a, 107b and the $n^+$-type source regions 108a, 108b, 108c are short-circuited via contacts 109a, 109b and a source metallization 110. A bottom side of the body regions 107a, 107b adjoins to p-type compensation zones 111a, 111b, respectively. Between the p-type compensation zones 111a, 111b, an n-type drift zone constituting part of the semiconductor body 101 is arranged. The n-type drift zone adjoins to an $n^+$-type drain region 112 at the second surface 103.

First gate structures 113a, 113b including first gate insulating layers 114a, 114b and first gate electrodes 115a, 115b are arranged on the body regions 107a, 107b at the first surface 102. The guard ring 106a in the edge termination area 104 is electrically coupled to the first gate electrodes 115a, 115b by an inverter structure 160 and a wiring 116. The wiring 116 is illustrated in a simplified manner and may include contact(s) and metal line(s). The inverter structure 160 may be formed as a CMOS (Complementary Metal Oxide Semiconductor) inverter, a bipolar inverter, a BiCMOS (Bipolar CMOS) inverter, an NMOS (n-channel MOS) inverter, a PMOS (p-channel MOS) inverter, for example. The inverter structure may be formed in a part of the semiconductor body 101 different from the part illustrated in FIG. 1, for example. The inverter structure 160 is a device configured to convert the potential in the guard ring 106a to a potential suitable of driving the first gate electrodes 115a, 115b. According to one embodiment, for example, when the potential of the guard ring 106a is more negative than the potential of the source metallization 110, the inverter structure 160 may apply a positive voltage to the first gate electrodes 115a, 115b, the positive voltage being related to the potential of the source metallization 110. When the potential of the guard ring 106a is more positive than that the potential of the source metallization 110, the inverter structure 160 may apply a voltage lower than or close to the voltage of the source metallization 110 to the first gate electrodes 115a, 115b. According to another embodiment, when the potential of the guard ring 106a falls below a threshold value related to the potential of the source metallization 110, the inverter structure 160 may apply a voltage close to the voltage of the source metallization 110 or a positive voltage to the first gate electrodes 115a, 115b. When the voltage of the guard ring 106a rises above this threshold voltage, a negative voltage related to the voltage of the source metallization 110 may be applied to the first gate electrodes 115a, 115b.

In the embodiment illustrated in FIG. 1, the first gate electrodes 115a, 115b are electrically coupled to the guard ring 106a. According to another embodiment, the first gate electrodes 115a, 115b are electrically coupled to another one of the guard rings.

A second gate structure 117a including a second gate insulating layer 118a and a second gate electrode 119a is arranged on the body region 107b at the first surface 102. The second gate electrode 119a is electrically coupled to a gate driving circuit (not illustrated in FIG. 1). Hence, the first gate electrodes 115a, 115b are electrically disconnected from the second gate electrode 119a. In other words, there is no low ohmic electrical connection between the first gate electrodes 115a, 115b and the second gate electrode 119a.

First field-effect structures 120a, 120b, which are normally-off, include the first gate structures 113a, 113b, the source regions 108a, 108c and a part of the body regions 107a, 107b. A second field-effect structure 121a, which is normally-off, includes the second gate structure 117a, the source region 108b and another part of the body region 107b. Both the first field-effect structures 120a, 120b and the second field-effect structure 121a share the drift zone and the drain region 112.

The first field-effect structures 120a, 120b are called MOS gated diodes (MGD) in the following and are electrically drivable independently from the second field-effect structure 121a. In the embodiment illustrated in FIG. 1, the first gate electrodes 115a, 115b are electrically coupled to the guard ring 106a in the edge termination area 104 via the inverter structure 160. The guard ring 106a is electrically disconnected from a gate driving circuit to which the second gate electrode 119a is electrically coupled. The schematic illustration of FIG. 1 only covers a part of the cell area 105. The overall cell area includes a plurality of the first field-effect structures and a plurality of the second field-effect structures. According to one embodiment, a number of the first field-effect structures in the overall cell area is smaller than the number of the second the second field-effect structures in the overall cell area.

When the MOSFET 100 is turned on, a body diode formed by the body regions 107a, 107b and the drift zone/drain region 112 is reversely biased by a small voltage $V_1$ and the second field-effect structure 121a can control a conductivity of a channel region between source and drain of the MOSFET 100 by the field-effect. Therefore, the second field-effect structure 121a is also referred to as a controllable field-effect structure. To control the conductivity of the channel region, an appropriate voltage is applied to the second gate electrode 119a to induce an inversion channel within the body regions 107b at the first surface 102 adjoining to the second gate structure 117a. In this mode, the electric potential of the guard ring 106a is electrically coupled to the first gate structures 113a, 113b by the inverter structure 160 also turning the first field-effect structures 120a, 120b on, i.e. the guard ring 106a provides a low level signal to the inverter structure 160 which is inverted to a high level signal supplied to the first gate structures 113a, 113b and turning on the normally-off first field-effect structures 120a, 120b. Thus, a load current is shared by the second field-effect structure 121a and the first field-effect structures 120a, 120b in this operation mode.

When the body diode of the MOSFET 100 is turned on, e.g. during switching of an inductive load, the body diode formed by the body regions 107a, 107b and the drift zone/drain region 112 is forwardly biased by a small voltage $V_2$ and the second field-effect structure 121a is turned off by an appropriate turn off signal at the second gate electrode 119a. In this mode, the electric potential of the guard ring 106a is electrically coupled to the first gate structures 113a, 113b by the inverter structure 160 turning the first field-effect structures 120a, 120b on, i.e. the guard ring 106a provides a low level signal to the inverter structure 160 which is inverted to a high level signal supplied to the first gate structures 113a, 113b and turning on the normally-off first field-effect structures 120a, 120b. Thus, a current path between source and drain of the first field-effect structures 120a, 120b is in parallel to a diode current flowing between the body regions 107a, 107b and the drift zone/drain region 112. This additional current path between source and drain of the first field-effect structures 120a, 120b leads to a reduction of the resistance of the body diode. Hence, switching losses determined by the product of current flow and voltage drop across the body diode can be decreased.

In a static blocking mode of the MOSFET 100, the body diode is reversely biased by a large voltage $V_3$, $|V_3|>>|V_1|$, and the second field-effect structure 121a is turned off by an appropriate signal at the second gate electrode 119a. In this mode, the electric potential of the guard ring 106a is electrically coupled to the first gate structures 113a, 113b by the inverter structure 160 turning the first field-effect structures 120a, 120b off, i.e. the guard ring 106a provides a high level signal to the inverter structure 160 which is inverted to a low level signal supplied to the first gate structures 113a, 113b and turning off the normally-off first field-effect structures 120a, 120b.

According to another embodiment, each voltage of the guard ring 106a above or equal to the potential of the source regions 108a, 108b, 108c may cause an appropriate low level signal at the output of the inverter structure 160 which is supplied to the first gate structures 113a, 113b for turning off the normally-off first field-effect structures 120a, 120b. In other words, the first field-effect structures 120a, 120b may be only in a conducting mode or turned on when the body diode is in a conducting mode and the first field-effect structures 120a, 120b may be in a blocking mode or turned off when the MOSFET 100 is in a conducting mode or when the body diode is in non-conducting mode.

Figure 2:
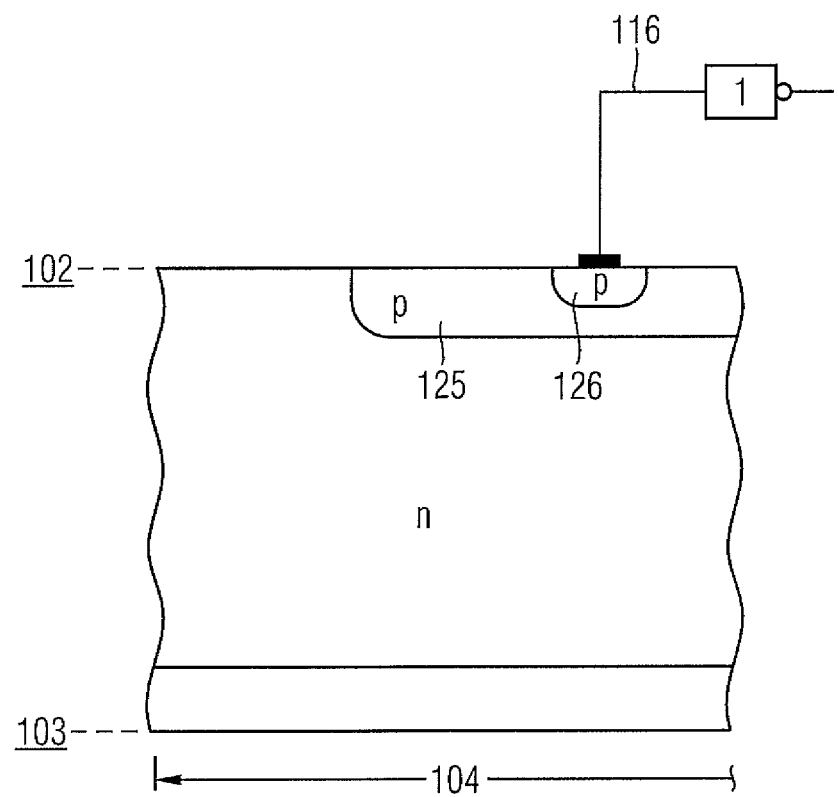
FIG. 2 is a schematic illustration of a junction termination extension (JTE) structure in the edge termination area as an alternative to the guard ring edge termination of the MOSFET illustrated in FIG. 1.

FIG. 2 schematically illustrates a Junction Termination Extension (JTE) structure in the edge termination area 104 of the MOSFET 100 as an alternative to the guard rings of the embodiment illustrated in FIG. 1. The JTE structure includes a first p-type zone 125 adjoining to the first surface 102. The first p-type zone 125 serves to reduce the amount of electric field crowding at the main pn-junction in the cell area 105 by increasing the depletion layer spreading, thereby decreasing the high electric field at the main pn-junction in the cell area 105. Variation Lateral Doping (VLD) may be used for the JTE structure.

The wiring 116 and the inverter structure 160 electrically couple a voltage tap including a second p-type zone 126 to the first gate electrodes 115a, 115b of the first field-effect structures 120a, 120b (not illustrated in FIG. 2, cf. FIG. 1). The second p-type zone 126 is arranged within the first p-type zone 125 of the JTE structure and may constitute part of the first p-type zone 125.

According to other embodiments, edge termination structures different from the ones illustrated in FIGS. 1 and 2 may be used, e.g. a combination of a selection or all of field plates, JTE-structures, VLD-structures and guard rings.

Figure 3:
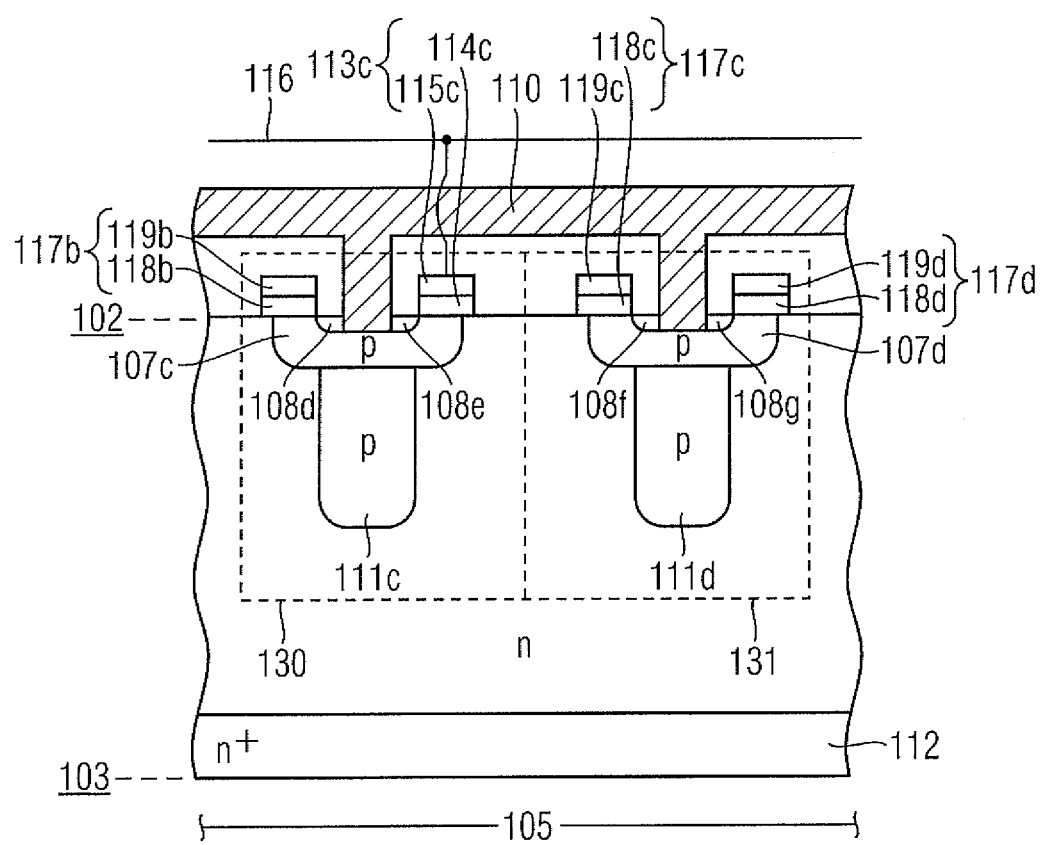
FIG. 3 is a schematic illustration of a vertical cross section through a part of the cell area of the MOSFET illustrated in FIG. 1 including a first transistor cell and a second transistor cell.

FIG. 3 schematically illustrates a vertical cross section through a part of the cell area 105 of the MOSFET 100 illustrated in FIG. 1. The cell area 105 includes a first transistor cell 130 and a second transistor cell 131. Whereas the first transistor cell 130 includes a first gate structure 113c similar to the gate structures 113a, 113b illustrated in FIG. 1 and a second gate structure 117b similar to the gate structure 117a illustrated in FIG. 1, the second transistor cell 131 includes only second gate structures 117c, 117d similar to the gate structure 117a illustrated in FIG. 1. Thus, only the first transistor cell 130 includes a gate electrode, i.e. the gate electrode 115c, that is electrically coupled to a voltage tap in the edge termination area 104 by the wiring 116 and the inverter structure 160 (not illustrated in FIG. 3).

According to one embodiment, 5% to 60% of cells of the cell area 105 include both the first field-effect structure and the second field-effect structure similar to the first transistor cell 130 illustrated in FIG. 3. The remaining cells of the cell area 105 include the second field-effect structure but not the first field-effect structure similar to the second transistor cell 131 illustrated in FIG. 3.

Figure 4:
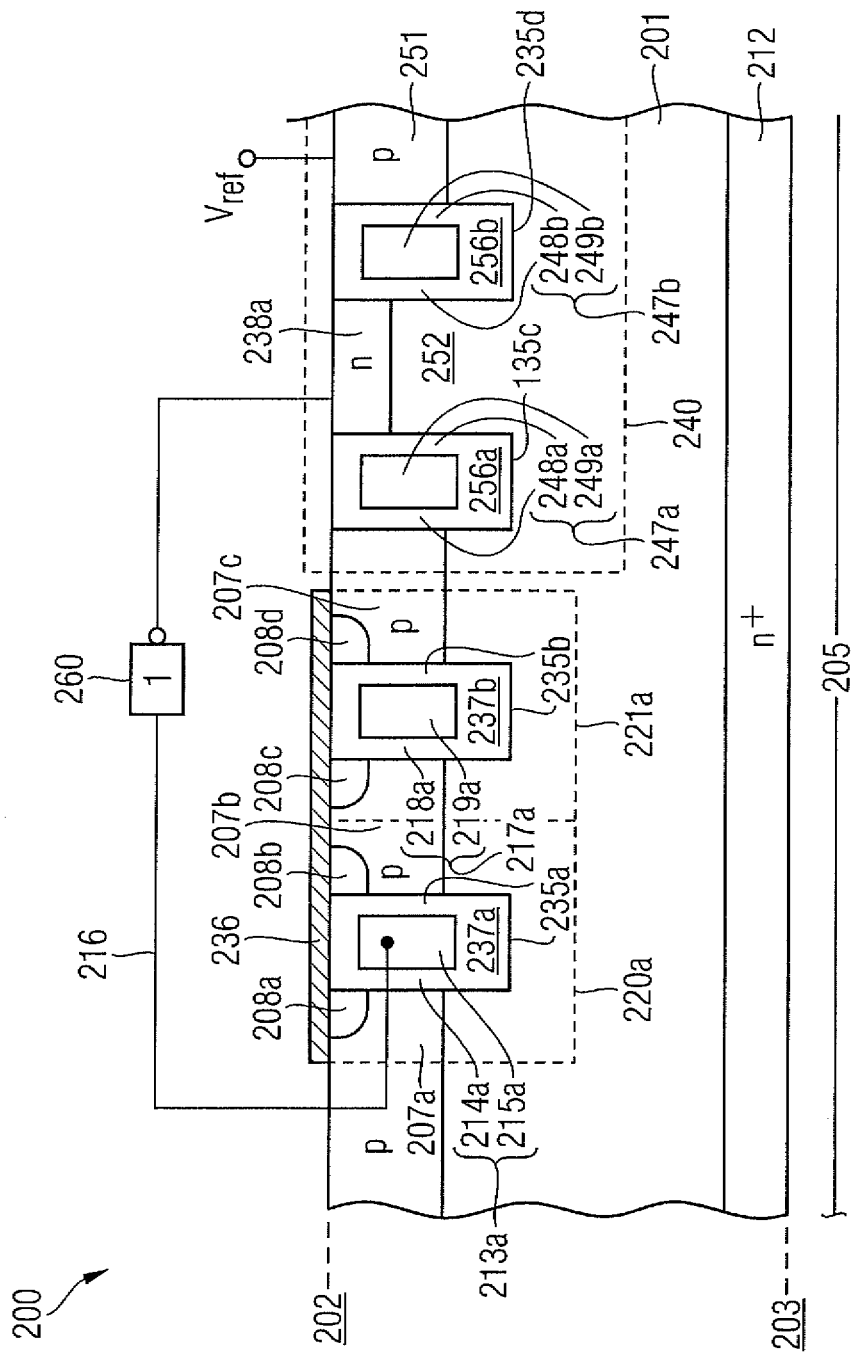
FIG. 4 is a schematic illustration of a vertical cross section through a part of a MOSFET including first and second field-effect structures, wherein a gate electrode of the first field electrode structures is electrically coupled to a source of a depletion transistor.

FIG. 4 schematically illustrates a vertical cross section though a part of a MOSFET 200 according to another embodiment. The MOSFET 200 includes an n-type semiconductor body 201 with a first surface 202 and a second surface 203. The first surface 202 may be at a front side of the semiconductor body 201 and the second surface 203 may be at a rear side of the semiconductor body 201. FIG. 4 illustrates the cross section in a vertical section plane which extends perpendicular to the first and second surfaces 202, 103.

The MOSFET 200 includes a cell area 205. The cell area 205 includes p-type body regions 207a, 207b, 207c and $n^+$-type source regions 208a, 208b, 208c, 208d. The p-type body regions 207a, 207b, 207c and the $n^+$-type source regions 208a, 208b, 208c, 208d are short-circuited. The short-circuit is illustrated in simplified manner by an interconnection 236 which includes a source metallization.

A first gate structure 213a including a first gate insulating layer 214a and a first gate electrode 215a is arranged in a trench 235a extending into the semiconductor body 201 from the first surface 202. The first gate insulating layer 214a is part of a dielectric structure 237a within the trench 235a. The first gate electrode 215a is electrically coupled to a source region 238a of a depletion transistor 240 by a wiring 216 and an inverter structure 260, which are illustrated in a simplified manner and may include contact(s), active semiconductor devices like e.g. transistors, and metal line(s).

A second gate structure 217a including a second gate insulating layer 218a and a second gate electrode 219a is arranged in a trench 235b extending into the semiconductor body 201 from the first surface 202 similar to the trench 235a. The second gate insulating layer 218a is part of a dielectric structure 237b within the trench 235b. The second gate electrode 219a is electrically coupled to a gate driving circuit (not illustrated in FIG. 4). Hence, the first gate electrode 215a is electrically disconnected from the second gate electrode 219a.

A first field-effect structure 220a includes the first gate structure 213a, the source regions 208a, 208b and a part of the body regions 207a, 207b. A second field-effect structure 221a includes the second gate structure 217a, the source regions 208c, 208d, another part of the body region 207b and a part of the body region 207c. Both the first field-effect structure 220a and the second field-effect structure 221a share a drift zone constituting part of the semiconductor body 201 and an $n^+$-type drain region 212.

Third gate structures 247a, 247b of the depletion transistor 240 include third gate insulating layers 248a, 248b and third gate electrodes 249a, 249b. The third gate insulating layers 248a, 248b are part of dielectric structures 256a, 256b within trenches 235c, 235d. A p-type discharge region 251 is electrically coupled to a terminal for a reference potential $V_{Ref}$. In the embodiment illustrated in FIG. 4, the discharge region 251 is arranged distant to the source region 238a and is arranged adjacent the third gate electrode 249b, or, more precisely, the third gate insulating layer 248b. In the embodiment illustrated in FIG. 4 the discharge region 251 is arranged directly below the first surface 202 and is separated from the source region 238a and a channel region 252 through the third gate electrode 249b and the third gate insulating layer 248b, respectively. The third gate structures 247a, 247b are electrically coupled to a reference potential, e.g. to a source potential of the source regions 208a, 208b, 208c, 208d.

When the MOSFET 200 is turned on, a body diode formed by the body regions 207a, 207b, 207c and the drift zone/drain region 212 is reversely biased by a small voltage $V_1$ and the second field-effect structure 221a can control a conductivity of a channel region between source and drain of the MOSFET 200 by the field-effect. Therefore, the second field-effect structure 221a is also referred to as a controllable field-effect structure. To control the conductivity of the channel region, an appropriate voltage is applied to the second gate electrode 219a to induce an inversion channel within the body regions 207b, 207c at side walls of the trench 235b. In this mode, the electric potential of the source region 238a of the depletion transistor 240 is electrically coupled to the first gate structure 213a by the inverter structure 260 also turning the first field-effect structure 220a on, i.e. the source region 238a of the depletion transistor 240 provides a low level signal to the inverter structure 260 which is inverted to a high level signal supplied to the first gate structure 113a and turning on the normally-off first field-effect structure 220a. Thus, a load current is shared by the second field-effect structure 221a and the first field-effect structures 220a in this operation mode.

When the body diode of the MOSFET 200 is turned on, e.g. during switching of an inductive load, the body diode formed by the body regions 207a, 207b, 207c and the drift zone/drain region 212 is forwardly biased by a small voltage $V_2$ and the second field-effect structure 221a is turned off by an appropriate turn off signal at the second gate electrode 219a. In this mode, the electric potential of the source region 238a of the depletion transistor 240 is electrically coupled to the first gate structure 213a by the inverter structure 260 turning the first field-effect structure 220a on, i.e. the source region 238a of the depletion transistor 240 provides a low level signal to the inverter structure 260 which is inverted to a high level signal supplied to the first gate structure 213a and turning on the normally-off first field-effect structure 220a. Thus, a current path between source and drain of the first field-effect structures 220a is in parallel to a diode current flowing between the body regions 207a, 207b, 207c and the drift zone/drain region 212. This additional current path between source and drain of the first field-effect structure 220a leads to a reduction of the resistance of the body diode. Hence, switching losses determined by the product of current flow and voltage drop across the body diode can be decreased.

In a static blocking mode of the MOSFET 200, the body diode is reversely biased by a large voltage $V_3$, $|V_3| >> |V_1|$, and the second field-effect structure 221a is turned off by an appropriate signal at the second gate electrode 219a. In this mode, the electric potential of the source region 238a of the depletion transistor 240 is electrically coupled to the first gate structure 213a by the inverter structure 260 turning the first field-effect structure 220a off, i.e. the source region 238a of the depletion transistor 240 provides a high level signal to the inverter structure 260 which is inverted to a low level signal supplied to the first gate structure 213a and turning off the normally-off first field-effect structure 220a.

According to another embodiment, each voltage of the source region 238a of the depletion transistor 240 above or equal to the potential of the source regions 208a, 208b, 208c, 208d may cause an appropriate low level signal at the output of the inverter structure 260 supplied to the first gate structures 213a for turning off the normally-off first field-effect structure 220a. In other words, the first field-effect structure 220a may be only in a conducting mode or turned on when the body diode is in a conducting mode and the first field-effect structure 220a may be in a blocking mode or turned off when the MOSFET 200 is in a conducting mode or when the body diode is in a non-conducting mode.

Figure 5:
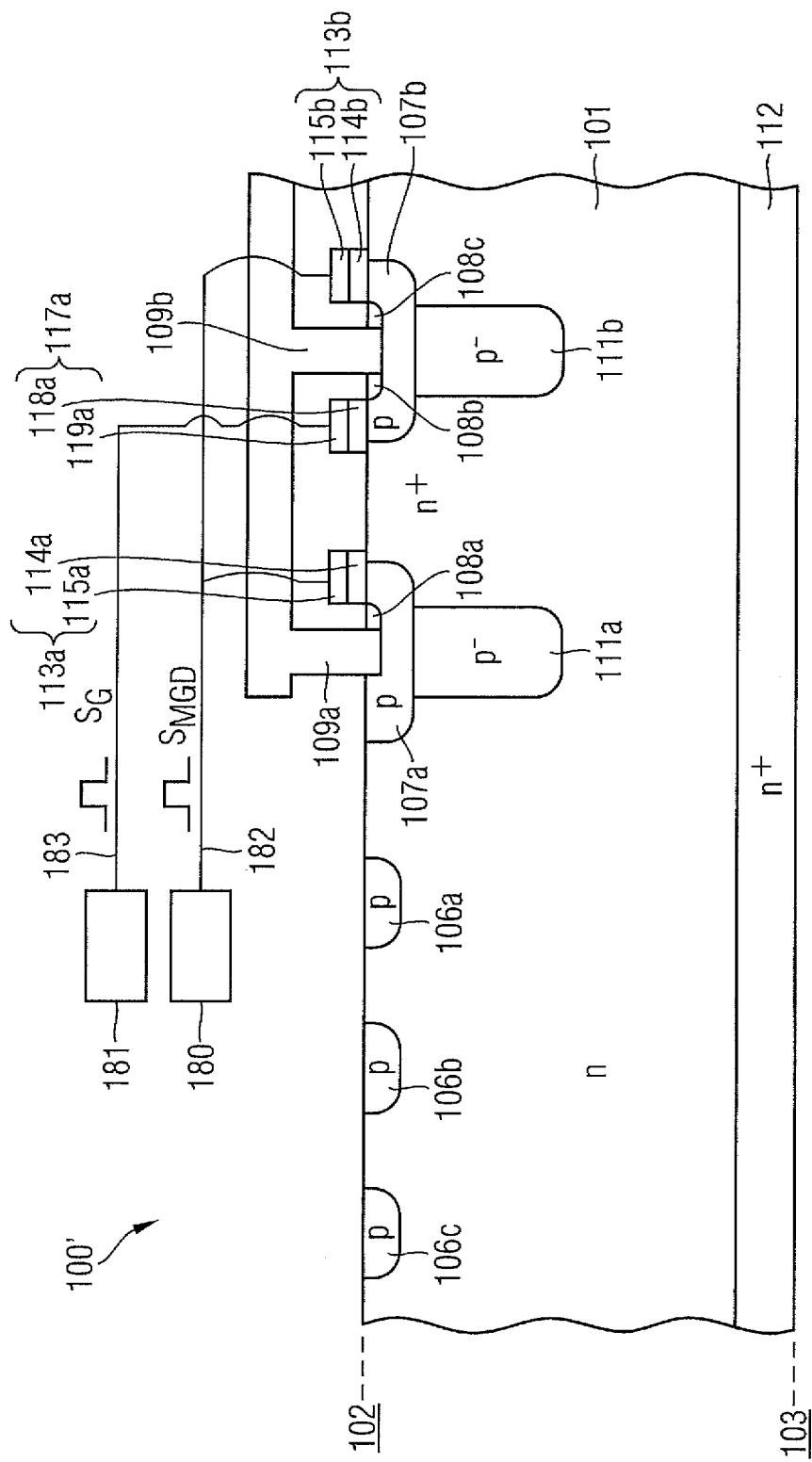
FIG. 5 is a schematic illustration of a vertical cross section through a part of a MOSFET including a first gate electrode of a first field-effect structure electrically coupled to a first gate driver circuit and a second gate electrode of the second field-effect structure electrically coupled to a second gate driver circuit different from the first gate driver circuit.

FIG. 5 schematically illustrates a vertical cross section through a part of a MOSFET 100' according to another embodiment. The MOSFET 100' is similar to the MOSFET 100 illustrated in FIG. 1, and differs from the MOSFET 100 in that the first gate electrodes 115a, 115b of the first gate structures 113a, 113b are electrically coupled to a first gate driver circuit 180 and not to the guard ring 106a as illustrated in FIG. 1. The second gate electrode 119a of the second gate structure 117a is electrically coupled to a second gate driver circuit 181 different from the first gate driver circuit 180. The first gate driver circuit 180 drives the first gate electrodes 115a, 115b with a first gate signal $S_{MGD}$ via a first signal line 182. The second gate driver circuit 181 drives the second gate electrode 119a with a second gate signal $S_G$ via a second signal line 183.

According to one embodiment, the first signal $S_{MGD}$ turns the first field-effect structures 120a, 120b on just before, e.g. 2 to 1000 ns, the second field-effect transistor 121a switches from a blocking mode to a forward biased mode of the body diode. The first signal $S_{MGD}$ turns the first field-effect structures 120a, 120b off just after, e.g. 2 to 1000 ns, the second field-effect transistor 121a has returned into the blocking mode. This allows to reduce the losses in the forward biased mode.

According to another embodiment, turning on the first field-effect structures 120a, 120b is slightly delayed and effected by the first signal $S_{MGD}$ shortly after, e.g. 2 to 1000 ns, the second field-effect structure 121a has turned into the forward biased mode of its body diode. This allows to reduce losses during the blocking mode.

Yet another embodiment for driving the first and second field-effect structures 120a, 120b, 121a may be applied to devices having a high voltage blocking capability, e.g. of more than 100 V. In these devices, a high ohmic resistance in the drift region may lead to a forward biasing voltage in the first field-effect structures 120a, 120b that is higher than in the second field-effect structure 121a. In this case, the first signal $S_{MGD}$ turns the first field-effect structures 120a, 120b on for reducing the flooding with electrons/holes just before the second field-effect structure 121a switches from the forward biased mode of the body diode into the blocking mode.

The timing of driving the first and second field-effect structures 120a, 120b, 121a by the first and second gate driver circuits 180, 181 can be specifc to the application and may depend upon a ratio of a loss in a forward biased mode and the loss due to leakage currents flowing in a blocking mode.

Figure 6:
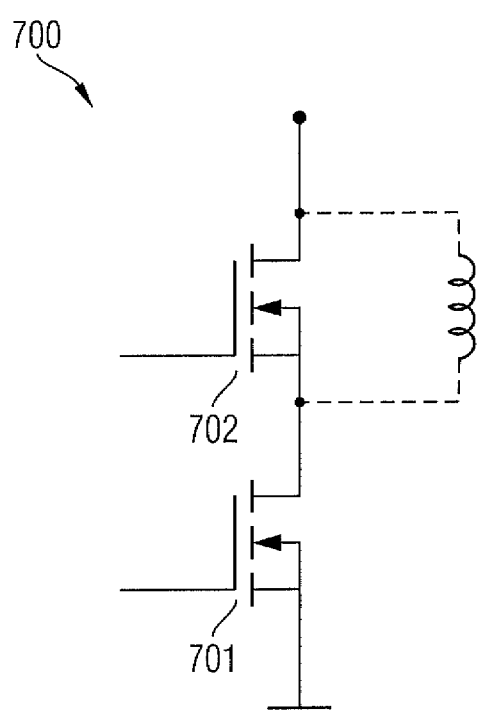
FIG. 6 is a schematic illustration of one part of an integrated circuit including a half-bridge circuit.

FIG. 6 schematically illustrates one part of an integrated circuit 700 including a half-bridge circuit with a first n-type channel normally-off MOSFET 701 and a second n-type channel normally-off MOSFET 702. At least one of the first and second MOSFETs 701, 702 is similar to one of the MOSFETs described in the embodiments above and includes first and second field-effect structures, wherein the gate electrodes of the first and second field-effect structures are electrically disconnected.

In the schematic illustration of FIG. 6, an inductive load is indicated by dashed lines. In this case, the second MOSFET 702 is similar to one of the MOSFETs described in the embodiments above.

It is to be understood that the features of the various embodiments described herein may be combined with each other, unless specifically noted otherwise.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a source metallization;
a semiconductor body including:
   a first field-effect structure including a source region of a first conductivity type electrically coupled to the source metallization; and
   a second field-effect structure including a source region of the first conductivity type electrically coupled to the source metallization; and
a voltage tap including a semiconductor region within the semiconductor body electrically coupled to a first gate electrode of the first field-effect structure by an intermediate inverter structure, the voltage tap being electrically coupled to only the first gate electrode with respect to the first gate electrode of the first field-effect structure and a second gate electrode of the second field-effect structure,
wherein the semiconductor region of the voltage tap is an electrically floating semiconductor zone of an edge termination structure.

2. The semiconductor device of claim 1, wherein the source regions of the first and second field-effect structures are short-circuited.

3. The semiconductor device of claim 1, further comprising a cell array of a first plurality of the first field-effect structure and a second plurality of the second field-effect structure, wherein the second plurality is larger than the first plurality.

4. The semiconductor device of claim 3, wherein 5% to 60% of cells of the cell array include both the first field-effect structure and the second field-effect structure, and wherein the remaining cells of the cell array include the second field-effect structure but not the first field-effect structure.

5. The semiconductor device of claim 1, wherein:
the first field-effect structure has a first capacitance including a first gate electrode, a first gate insulator and a first body region;
the second field-effect structure has a second capacitance including a second gate electrode, a second gate insulator and a second body region; and
the first capacitance per unit area is larger than the second capacitance per unit area.

6. The semiconductor device of claim 5, wherein a thickness of the second gate insulator between the second gate electrode and the second body region is larger than the thickness of the first gate insulator between the first gate electrode and the first body region.

7. The semiconductor device of claim 1, wherein the semiconductor device is a vertical metal-oxide-semiconductor field-effect transistor having a voltage blocking capability in a range of 50 V to 1500 V.

8. The semiconductor device of claim 1, wherein the semiconductor device is part of a reverse conducting insulated gate bipolar transistor.

9. The semiconductor device of claim 1, wherein the first field-effect structure and the second field-effect structure share a common drain.

10. The semiconductor device of claim 1, wherein the edge termination structure is a guard ring structure.

11. The semiconductor device of claim 1, wherein the edge termination structure is part of a junction termination extension structure.

12. The semiconductor device of claim 1, wherein the semiconductor region of the voltage tap adjoins a surface of the semiconductor body.

13. The semiconductor device of claim 1, wherein the voltage tap is configured to tap a voltage at a location deeper within the semiconductor body than a bottom side of a body region of the second field-effect structure.

14. The semiconductor device of claim 1, wherein the first gate electrode of the first field-effect structure and a second gate electrode of the second field-effect structure are planar gate electrodes arranged above a surface of the semiconductor body.

15. The semiconductor device of claim 1, wherein the voltage tap is electrically coupled to an input of the inverter structure and the first gate electrode of the first field-effect structure is electrically coupled to an output of the inverter structure.

16. The semiconductor device of claim 1, wherein the first gate electrode of the first field-effect structure and a second gate electrode of the second field-effect structure are electrically disconnected.

* * * * *